(12) United States Patent
Boenapalli et al.

(10) Patent No.: US 10,725,706 B1
(45) Date of Patent: Jul. 28, 2020

(54) APPARATUS AND METHOD OF SCHEDULING UNIVERSAL FLASH STORAGE REFRESH OPERATIONS ACCORDING TO A REFRESH HANDOVER MECHANISM

(71) Applicant: QUALCOMM Incorporated, San Diego, CA (US)

(72) Inventors: Madhu Yashwanth Boenapalli, Hyderabad (IN); Hyunsuk Shin, San Diego, CA (US); Surendra Paravada, Hyderabad (IN); Sai Praneeth Sreeram, Anantapur (IN); Venu Madhav Mokkapati, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/255,477

(22) Filed: Jan. 23, 2019

(51) Int. Cl.
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
CPC ..... G06F 3/0659; G06F 3/0604; G06F 3/0679
USPC .......................................... 711/103
See application file for complete search history.

(56) References Cited

U.S. PATENT DOCUMENTS

2016/0179376 A1* 6/2016 Ramalingam ....... G06F 12/0804
711/103
2017/0365352 A1* 12/2017 Shin .................... G06F 12/0246

\* cited by examiner

*Primary Examiner* — Mardochee Chery
(74) *Attorney, Agent, or Firm* — Qualcomm Incorporated/Seyfarth

(57) ABSTRACT

A method of scheduling universal flash storage (UFS) operations using a refresh handover mechanism is described. The method includes receiving, during refresh of a UFS device, a request for an input/output (I/O) operation. The method also includes handing over between a first type of refresh operation and a second type of refresh operation in response to the request for the I/O operation.

10 Claims, 6 Drawing Sheets

US 10,725,706 B1

APPARATUS AND METHOD OF SCHEDULING UNIVERSAL FLASH STORAGE REFRESH OPERATIONS ACCORDING TO A REFRESH HANDOVER MECHANISM

BACKGROUND

Field

The present disclosure generally relates to apparatuses incorporating integrated circuits (ICs). More specifically, aspects of the present disclosure relate to an apparatus and method of scheduling universal flash storage (UFS) refresh operations according to a refresh handover mechanism.

Background

Electronic devices, such as computers, smart phones, mobile devices, Internet of Things (IoT), and other like mobile platform devices are continually driving the demand for faster data. Conventional volatile memory used in mobile platform devices may be unable to handle and facilitate the voluminous data consumed by such mobile platform devices. One option for meeting this ever expanding volume of data is using high speed non-volatile (NV) memory devices. For example, flash memory is one possible type of NV memory device that may be capable of meeting this ever expanding volume of data consumed by mobile platform devices.

A flash memory storage device is a type of non-volatile memory implemented using solid-state drive (SSD) technology. For example, SSD-based flash memory is an electronic non-volatile computer storage device capable of maintaining, erasing, and/or reprogramming data. Flash memory can be fabricated with several different types of integrated circuit (IC) technologies, such as a negative logical OR (NOR) gate or a negative logical AND (NAND) gate using, for example, floating-gate transistors. This flash memory can be configured to support block-based, page-based, word-based, and/or byte-based memory access, depending on the type of supported applications.

The internal memories of the noted mobile platform devices may be implemented using universal flash storage (UFS). Universal flash storage or UFS is a flash storage specification for consumer electronic devices, such as mobile phones, digital cameras, and other like consumer electronic devices specifying high performance and low power consumption. Unfortunately, universal flash storage is susceptible to memory corruptions, such as bit-flip errors and transmission errors. Selecting a memory refresh operation for universal flash storage is generally performed in a non-intelligent manner.

SUMMARY

A method of scheduling universal flash storage (UFS) operations using a refresh handover mechanism is described. The method includes receiving, during refresh of a UFS device, a request for an input/output (I/O) operation. The method also includes handing over between a first type of refresh operation and a second type of refresh operation in response to the request for the I/O operation.

An apparatus configured to scheduling universal flash storage (UFS) operations using a refresh handover mechanism is described. The apparatus includes a memory having a UFS device and at least one processor coupled to the memory. The processor is configured to receive, during refresh of the UFS device, a request for an input/output (I/O) operation. The processor is also configured to handover between a first type of refresh operation and a second type of refresh operation in response to the request for the I/O operation.

A non-transitory computer-readable medium having program code recorded thereon for scheduling universal flash storage (UFS) operations using a refresh handover mechanism is described. The program code executed by a processor. The program code includes program code to receive, during refresh of a UFS device, a request for an input/output (I/O) operation. The program code also includes program code to handover between a first type of refresh operation and a second type of refresh operation in response to the request for the I/O operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
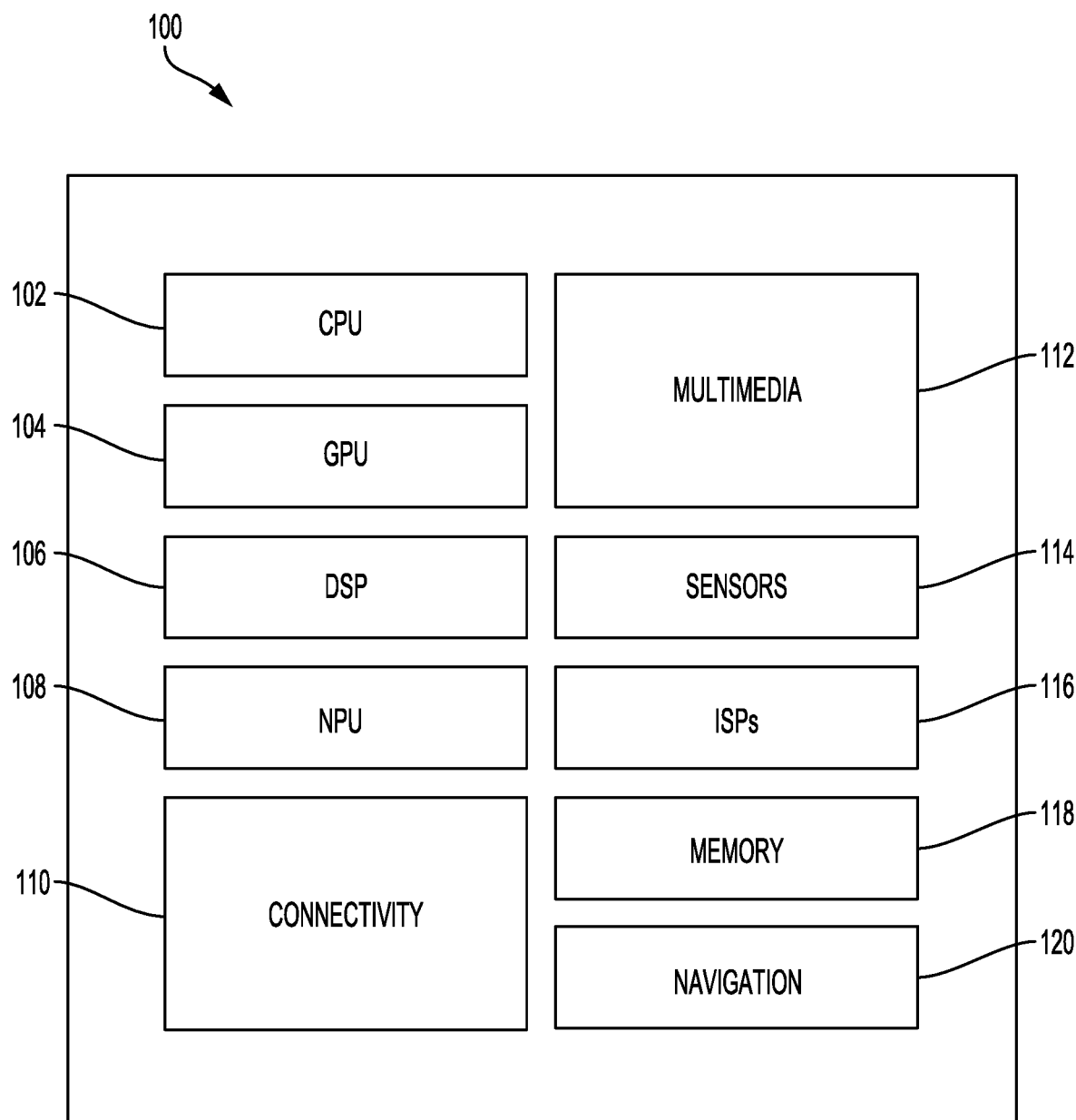
FIG. 1 illustrates an example implementation of a system-on-a-chip (SOC), including a connectivity module, in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. The apparatus may, for example, be one of a computing system (e.g., servers, datacenters, desktop computers), mobile computing device (e.g., laptops, cell phones, vehicles, etc.), Internet of Things device, and virtual reality or augmented reality system. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

As described herein, the use of the term "and/or" is intended to represent an "inclusive OR", and the use of the term "or" is intended to represent an "exclusive OR". The word "exemplary" is used herein to mean "serving as an example, instance, or illustration." Any aspect described herein as "exemplary" is not necessarily to be construed as preferred or advantageous over other aspects.

Although particular aspects are described, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure, rather than limiting the scope of the disclosure being defined by the appended claims and equivalents thereof.

Internal memories of mobile platform devices may be implemented with universal flash storage (UFS). Universal flash storage or UFS is a flash storage specification for consumer electronic devices, such as mobile phones, digital cameras, and other like consumer electronic devices specifying high performance and low power consumption. Flash memory is a type of non-volatile memory implemented using solid-state drive (SSD) technology. For example, SSD-based flash memory is an electronic non-volatile computer storage device capable of maintaining, erasing, and/or reprogramming data.

Universal flash storage can be fabricated with several different types of integrated circuit (IC) technologies, such as a negative logical OR (NOR) gate or a negative logical AND (NAND) gate using, for example, floating-gate transistors. Unfortunately, universal flash storage is susceptible to memory corruptions, such as bit-flip errors and transmission errors. These memory corruptions may be due to various reasons, such as aging factors, temperature changes, charge loss, and the like. For example, universal flash storage implemented using NAND memory may undergo bit-flipping for various reasons, such as memory manufacturing defects during ionizations, high strain on a memory cell during read operations, and/or charge loss.

Current memory refresh schemes for universal flash storage include a manual-force refresh method and a manual-selective refresh method. Selecting between a manual-force and a manual-selective refresh method for refreshing universal flash storage is generally performed in a non-intelligent manner. That is, the decision to select between manual-force and manual-selective refresh is not made based on system performance feedback and/or current power specifications. According to aspects of the present disclosure, selecting between a manual-force refresh method and a manual-selective refresh method for refreshing universal flash storage is based on current power and performance constraints.

FIG. 1 illustrates an example implementation of a host system-on-a-chip (SOC) 100, which includes a connectivity block 110 (e.g., a host controller) configured to schedule universal flash storage (UFS) refresh schemes using a refresh handover mechanism, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advance RISC machine (ARM), a microprocessor, or some other type of processor. The NPU 108 may be based on an ARM instruction set.

In an aspect of the present disclosure, the instructions loaded into the multi-core CPU 102 may include program code to receive, during refresh of a UFS device, a request for an input/output (I/O) operation. The instructions loaded into the multi-core CPU 102 may also include program code to handover between a first type of refresh operation and a second type of refresh operation in response to the request for the I/O operation.

A non-transitory computer-readable medium having program code recorded thereon for scheduling universal flash storage (UFS) operations using a refresh handover mechanism is described. The program code executed by a processor. The program code includes program code to. The program code also includes program code to handover between a first type of refresh operation and a second type of refresh operation in response to the request for the I/O operation.

Figure 2:
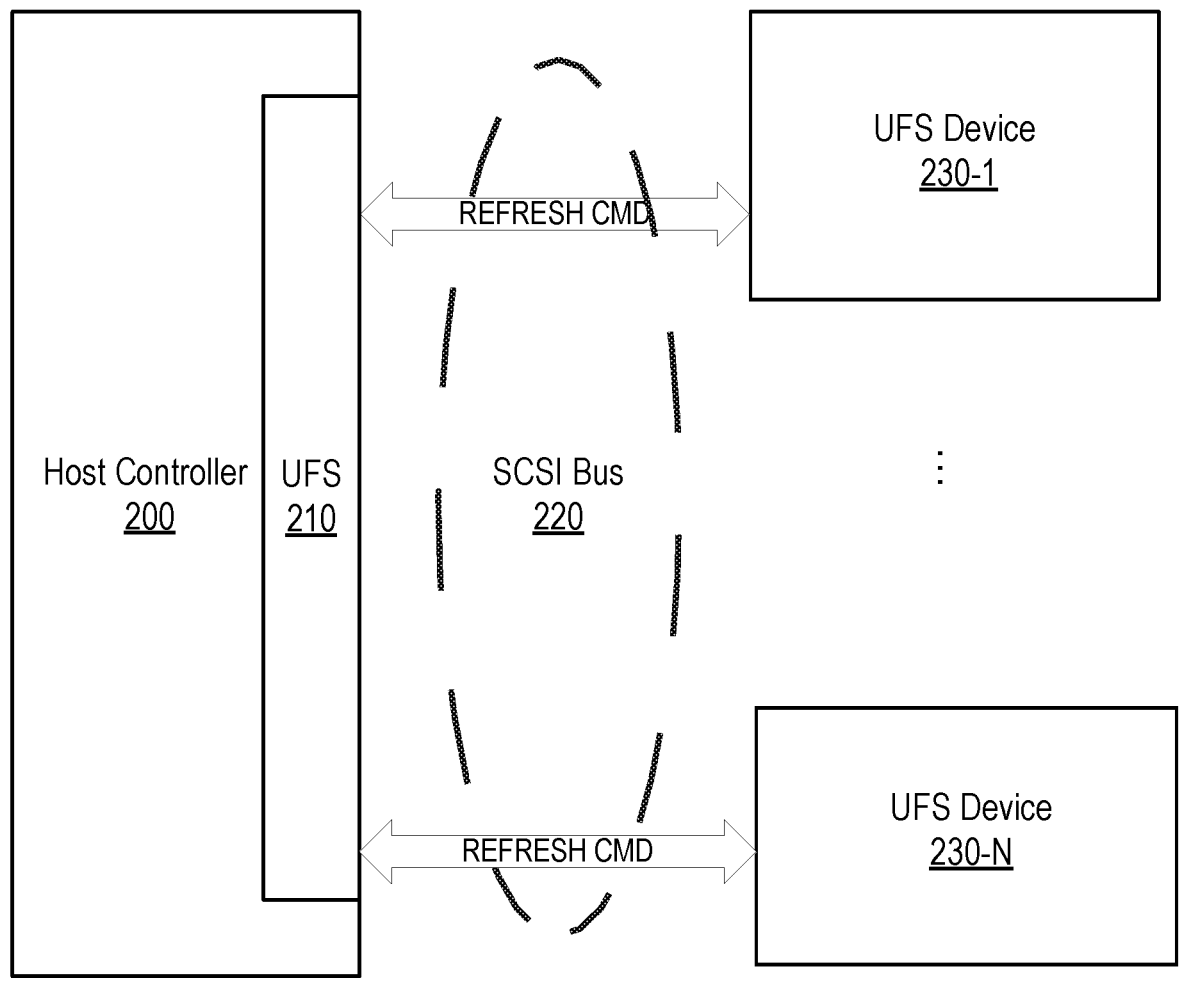
FIG. 2 is an example implementation illustrating a host controller communicably coupled to universal flash storage (UFS) devices, in accordance with aspects of the present disclosure.

FIG. 2 is an example implementation illustrating a host controller configured to schedule universal flash storage (UFS) refresh schemes of UFS devices using a refresh handover mechanism, in accordance with aspects of the present disclosure. In this configuration, a host controller 200 may be the host SOC 100, or a block of the host SOC 100 (e.g., connectivity block 110 or other like block of the host SOC 100) including a UFS interface 210. In this example, the host controller 200 includes the UFS interface 210, configured to communicate with UFS devices 230 (230-1, . . . , 230-N) over, for example, a small computer system interface (SCSI) bus 220.

As previously noted, the UFS devices 230 are susceptible to memory corruptions, such as bit-flip errors and transmission errors. Current memory refresh schemes for refreshing the UFS devices 230 include a manual-force refresh method and a manual-selective refresh method. The decision to select between the manual-force and the manual-selective refresh method is not made based on system performance feedback and/or current power specifications. According to aspects of the present disclosure, selecting between a manual-force refresh method and a manual-selective refresh method for refreshing the UFS devices 230 is based on current power and performance constraints.

Figure 3A:
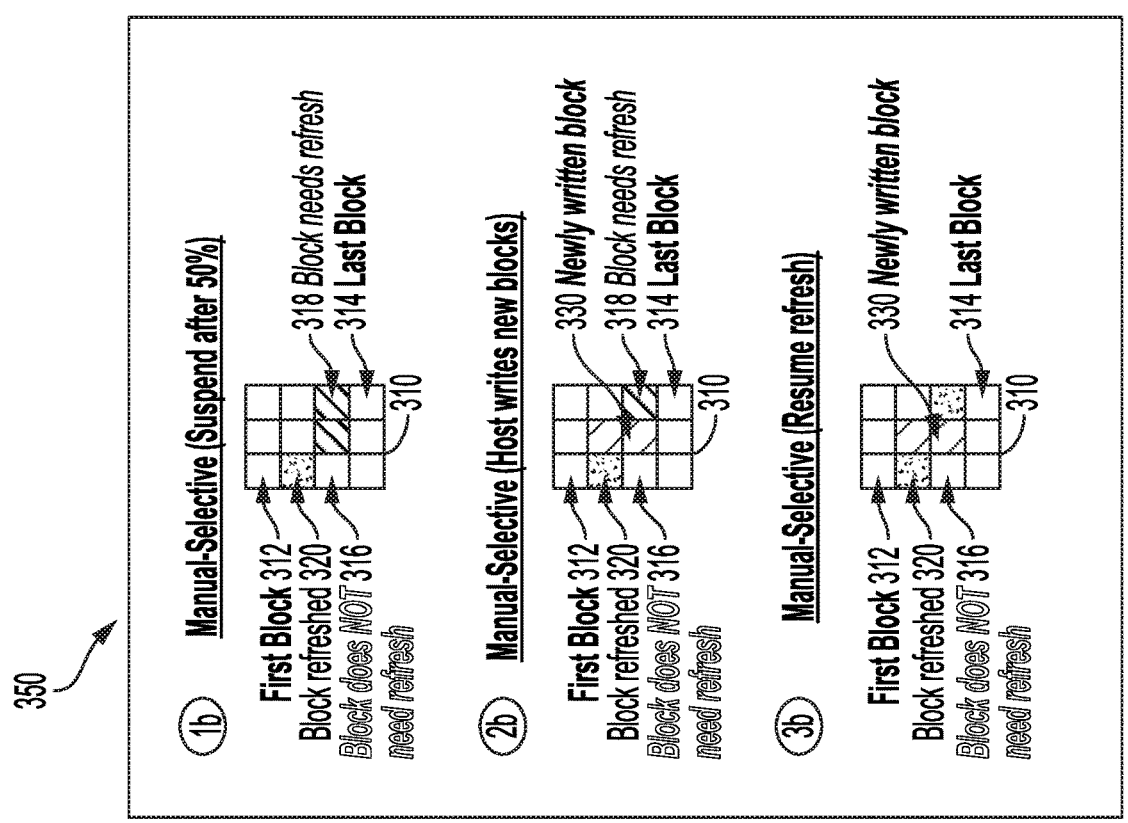
FIGS. 3A and 3B are block diagrams illustrating a manual-force refresh method and a manual-selective refresh method, according to aspects of the present disclosure.
Figure 3B:
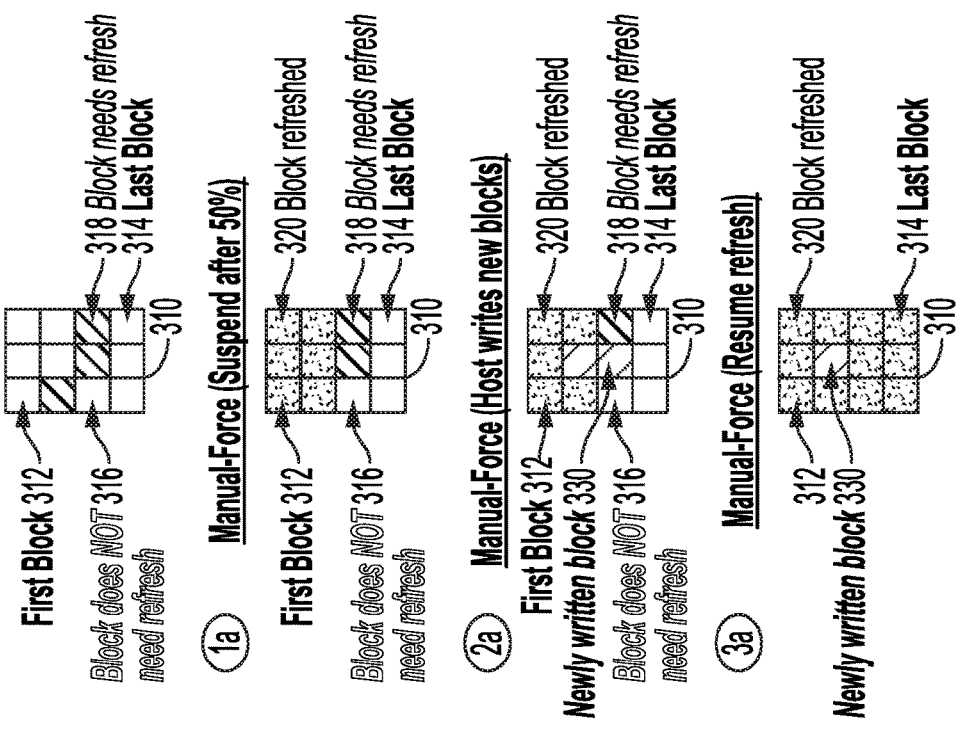

FIGS. 3A and 3B are block diagrams illustrating a manual-force refresh method and a manual-selective refresh method, according to aspects of the present disclosure. FIG. 3A is a block diagram 300 illustrating a manual-force refresh method on a group of data blocks, according to aspects of the present disclosure. In this example, data blocks 310 are shown in a group, including a first block 312 and a last block 314. The data blocks 310 include blocks that do not need a refresh (e.g., no-refresh blocks 316) and blocks that need a refresh (e.g., need-refresh blocks 318).

As shown in step 1a, a manual-force refresh is applied to the data blocks 310 and suspended after manually refreshing half of the data blocks 310 (e.g., suspend after 50%) to form refreshed blocks 320. As shown in step 2a, a host (e.g., host controller 200 of FIG. 2) writes to new blocks 330 of the data blocks 310. In this example, the manual-force refresh is suspended so that the host controller 200 writes to the new blocks 330. Following writing to the new blocks 330, the data blocks 310 include the refreshed blocks 320, the new blocks 330, no-refresh blocks 316, and a need-refresh block 318.

In step 3a, the manual-force refresh resumes refresh of each remaining block of the data blocks 310. Using manual-force refresh, each of the data blocks 310 is refreshed except for the new block 330. In this example, the host controller 200 performs manual-force refresh by selecting a block of the data blocks 310 and reading all the pages in the block. In this manual-force refresh process, the host controller 200 refreshes each page of the selected block, regardless of whether an error occurs. In this way, the host controller 200 continuously performs manual-force refresh in the foreground on all the blocks/pages of the data blocks 310, which may be referred to as the manual-force refresh constraint.

FIG. 3B is a block diagram 350 illustrating a manual-selective refresh method on a group of data blocks, according to aspects of the present disclosure. In this example, the data blocks 310 are also shown in a group, including the first block 312 and the last block 314. The data blocks 310 include no-refresh blocks 316 and need-refresh blocks 318.

As shown in step 1b, a manual-selective refresh is applied to the data blocks 310 and suspended after manually refreshing half of the data blocks 310 (e.g., suspend after 50%) to form a refreshed block 320. The manual-selective refresh is applied to a first of the need-refresh blocks 318 in the first half of the data blocks 310. As shown in step 2b, the host controller 200 also writes to new blocks 330 of the data blocks 310. In this example, the manual-selective refresh is suspended, allowing the host controller 200 to write to the new blocks 330. Following writing of the new blocks 330, the data blocks 310 include the refreshed block 320, the new blocks 330, a need-refresh block 318, and no-refresh blocks 316.

In step 3b, the manual-selective refresh resumes to refresh the need-refresh block 318 of the data blocks 310. In this example, the data blocks 310 include the refreshed block 320, the new blocks 330, and no-refresh blocks 316. The host controller 200 performs the manual-selective refresh by refreshing only the blocks which are marked for refresh (e.g., need-refresh blocks 318) and does not bother with the other blocks of the data blocks 310.

As shown in FIGS. 3A and 3B, a current Joint Electron Device Engineering Council (JEDEC) document (e.g., Item # JC-64.1-135.12 (Rev-5)) prohibits concurrent access of input/output (I/O) and fresh operations with respect to the universal flash storage (UFS) standard (e.g., the UFS 3.0 Standard). That is, issuing the I/O operation to write the new block 330 suspends both the manual-force refresh operation in FIG. 3A and the manual-selective refresh operation in FIG. 3B. As specified by the current JEDEC document, the host controller 200 should set a refresh enable flag (e.g., fRefreshEnable) if command queues are empty; otherwise, a query request to set the refresh enable flag may fail. If a refresh operation is in progress, any request, other than a READ request, triggers the refresh interruption described above.

According to this refresh implementation, the host controller 200 decides the type of refresh to perform by setting a first refresh value (e.g., 01h) for a manual-force or a second refresh value (e.g., 02h) for a manual-selective refresh operation. The host controller 200 sets the first refresh value or the second refresh value in a refresh register (e.g., *bRefreshMethod*) in accordance with the noted JEDEC document. Unfortunately, the decision of selecting between the first refresh value and the second refresh value is not pre-defined; this decision is random. Consequently, a problem occurs if the first refresh value (e.g., manual-force refresh mode) is set when a concurrent I/O request (e.g., a high performance I/O operation) is received from a userspace.

As noted, the JEDEC document prohibits concurrent access of I/O and fresh operations. Therefore, due to the manual-force refresh constraint (e.g., involving all pages/blocks), the manual-force refresh operation is paused, while the I/O operation is performed. Once completed, the manual-force refresh operation resumes. This scenario is problematic because pausing the manual-force refresh operation to process the I/O request significantly contributes to power usage. Unfortunately, selection between manual-force and manual-selective refresh does not consider feedback about the current system performance and power specifications. To address this problem, a solution is proposed for intelligently selecting the type of refresh scheme by considering the performance and power constraints associated with the selected refresh scheme.

Aspects of the present disclosure enable parallel execution of I/O and refresh operations. Parallel execution of I/O and refresh operations is beneficial in the following scenarios because ignoring the refresh operations results in a high start/stop penalty for refresh operations based on a rate of I/O requests. For example, as a storage device gets older, the refresh rate increases to maintain data retention. Similarly, when the host controller 200 detects unexpected weak memory cells in a certain partition of the UFS devices 230 (e.g., implemented in the field), the host controller 200 can request a higher refresh rate for that partition. The host controller 200 can also request more frequent refresh at higher temperatures. The host controller 200 can also request different refresh rates for different memory types. For example, a refresh rate of triple level cell (TLC) memory is generally greater than a refresh rate for multi-level cell (MLC) memory, which is greater than a refresh rate for single level cell (SLC) memory.

In the existing art, I/O operations are generally prioritized over refresh operations for achieving the short team goal of finishing I/O requests first. This prioritization of I/O operations ignores the importance of device life (e.g., a long term goal). Currently, there is a trade-off between I/O and refresh operations. Aspects of the present disclosure use this trade-off to balance both I/O requests and refresh requests by handling these competing requests in a graceful manner. Balancing I/O and refresh requests may be advantageous in automotive storage devices (e.g., dashboards in cars and drones that are directly exposed to environmental heat). For example, using the UFS devices 230 as an automotive storage device would involve a higher frequency of refresh operations.

Figure 4:
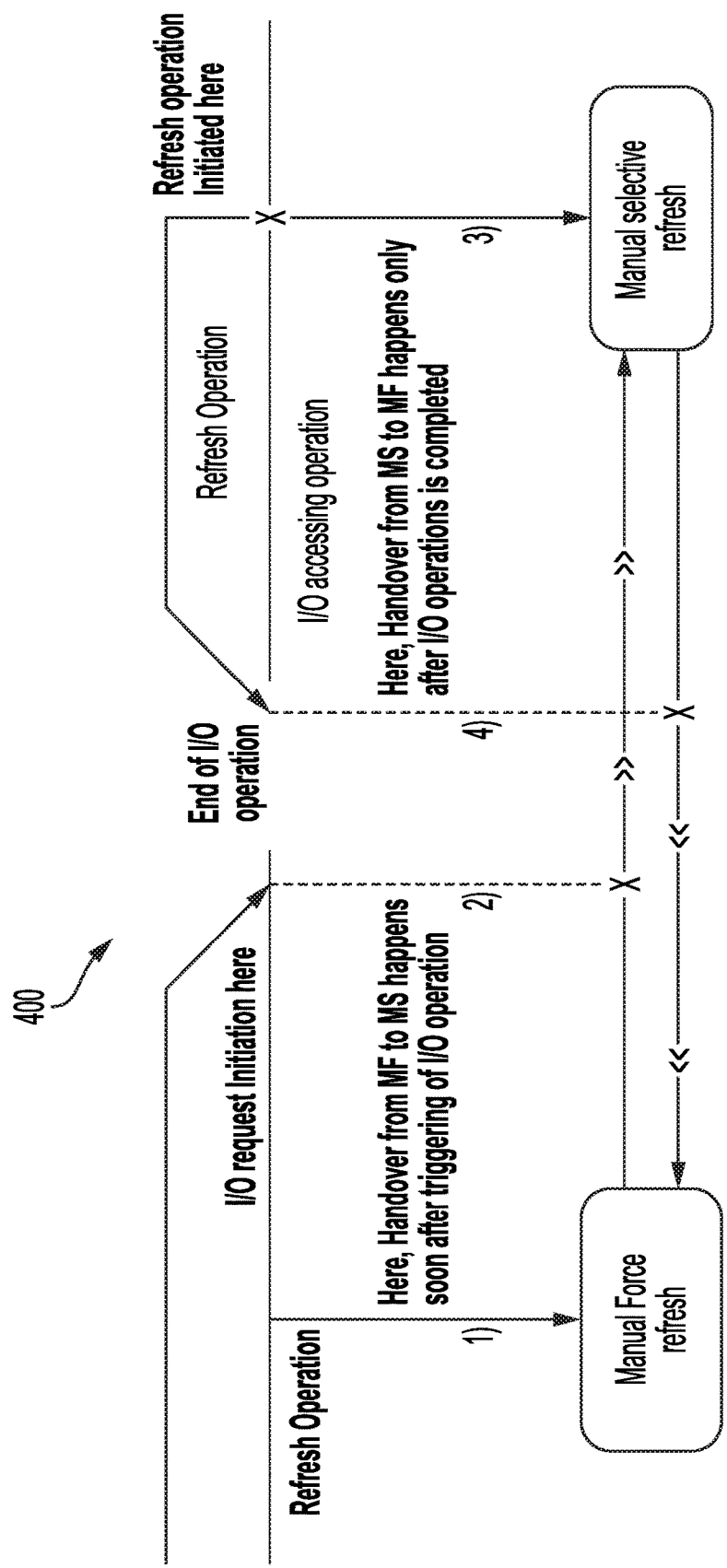
FIG. 4 is a state diagram illustrating scheduling of universal flash storage (UFS) refresh schemes, according to aspects of the present disclosure.

FIG. 4 is a state diagram illustrating scheduling of universal flash storage (UFS) refresh schemes using a refresh handover mechanism, according to aspects of the present disclosure. Representatively, a UFS refresh state diagram 400 is illustrated for addressing scenarios in which refresh operations and I/O operation are performed in parallel. The UFS refresh state diagram 400 provides various state transitions based on the following scenarios: 1) only refresh operation; 2) I/O request during the refresh operation; 3) refresh operation during an I/O operation; and 4) I/O access operation completes while refresh in progress. In this configuration, the UFS refresh state diagram 400 is based on the following rules: (A) manual-force refresh operations cannot happen in parallel with an I/O operation (e.g., due to conflicting access to the same block); and (B) refresh power and refresh time for a manual-force refresh are always greater than the refresh power and the refresh time of a manual-selective refresh.

Aspects of the present disclosure describe a UFS refresh scheduling scheme, in which a refresh handover mechanism from manual-force refresh to manual-selective refresh is performed in response to an I/O request. This refresh handover mechanism is designed to enforce rules (A) and (B). This implementation enables execution of I/O and refresh operations with improved performance and power saving.

As shown in FIG. 4, a scheduler (e.g., the host controller 200 of FIG. 2) intelligently selects the refresh scenario type and when handover between the refresh mechanisms should happen (see Table 1). For example, considering scenario 2), handover should happen from manual-force (MF) to manual-selective (MS) refresh for complying with the rules described in (A) and (B). Alternatively, in scenario 4), handover should happen from manual-selective to manual-force refresh for having robust data retention and making sure all the data is refreshed in the background.

TABLE 1

UFS Refresh Scheduling

| I/O Request | Refresh Request | Type of Refresh |
| --- | --- | --- |
| 0 | 1 | MF |
| 1 | 0 | NA |
| 1 (I/O first) | 1 | MS ->MF, Handover, once the I/O request is complete |
| 1 | 1 (Refresh first) | MF ->MS, Handover, once the I/O request is initiated. |

Total refresh equation: $R(MF)+R(MF) \cdot I/O(MS)+I/O(MS) \cdot R(MF)$ (1)

Table 1 shows a UFS refresh scheduling lookup table, according to aspects of the present disclosure. For example, the host controller 200 may be configured according to the UFS refresh scheduling lookup table to operate according to the UFS refresh state diagram 400. In this example, the UFS scheduling method complies with the rules of (A) and (B), as shown by the total refresh equation (1). The host controller intelligently performs handover between manual-selective and manual-force refresh by either performing the handover once the competing I/O request is initiated, or once the I/O request completes. This refresh handover mechanism avoids the stop/start penalty caused by pausing manual-force refresh operations to complete I/O requests.

For example, the total refresh equation (1) may be derived as follows based on Table 1. As shown in case-1 (e.g., 01), in which there is only a request for Refresh, and no I/O request, the type of refresh selected MF refresh. Hence, case-1 contributes $R \cdot (MF)$ to the total refresh equation (1). Case-2 (e.g., 10) does not contribute to the total refresh equation (1). Case-3 (e.g., 11—I/O first) is considered after case-4. In case-4 (e.g., 11—refresh first), the type of refresh selected is MF refresh. Meanwhile, if there is a 110 request when refresh is being processed, a refresh handover is perform from MF refresh to MS refresh. Hence, case-4 contributes $R(MF) \cdot I/O(MS)$ to the total refresh equation (1). Regarding case-3, after the handover request from MF refresh to MS refresh is performed, the current refresh status is MS refresh. Once the IO being served here is completed, a handover from MS refresh to MF refresh is performed. Hence case-3 contributes $I/O(MS) \cdot R(MF)$ to complete the total refresh equation (1).

Implementing this UFS scheduling scheme involves defining new standard registers in the UFS devices 230. The new standard registers may include a register (e.g., REG_REF_EN) to start/stop refresh operation, a register (e.g., REG_SEL_ALGO) to select a type of refresh scheme, and a register (e.g., REG_REF_ADDR_RANGE) for a target start/end address range. A partition range can be selected by setting a start address equal to an end address (e.g., 0x0).

In operation, the host controller 200 sets the REG_REF_EN register to start a refresh operation. In addition, the host controller 200 programs the REG_REF_ADDR_RANGE register and a REG_SEL_ALGO register before starting a refresh operation. The UFS devices 230 may run the refresh operation in the background. The REG_REF_EN register is cleared to 0 by the UFS devices 230 when the refresh operation is complete. In addition, the host controller 200 can check REG_REF_EN register to see if a refresh operation is on-going or completed to perform according to the UFS refresh scheduling lookup table (see Table 1) when operating according to the UFS refresh state diagram 400.

While the refresh operation is on-going, the host controller 200 clears the REG_REF_EN register to 0 to stop the refresh operation. For example, during scenarios such as 2) and 4), where the refresh handover mechanism should occur, a bit in the REG_REF_EN register is set to '0' and the REG_SEL_ALGO register is negated and then set back to '1' with the change in refresh scheme. The refresh operation might also be interrupted in the middle. In this scenario, the host controller 200 restarts the refresh operation for the target address range later corresponding to the REG_REF_ADDR_RANGE register. In operation, the new refresh scheme picks the address where it stopped and resumes the refresh operations.

Figure 5:
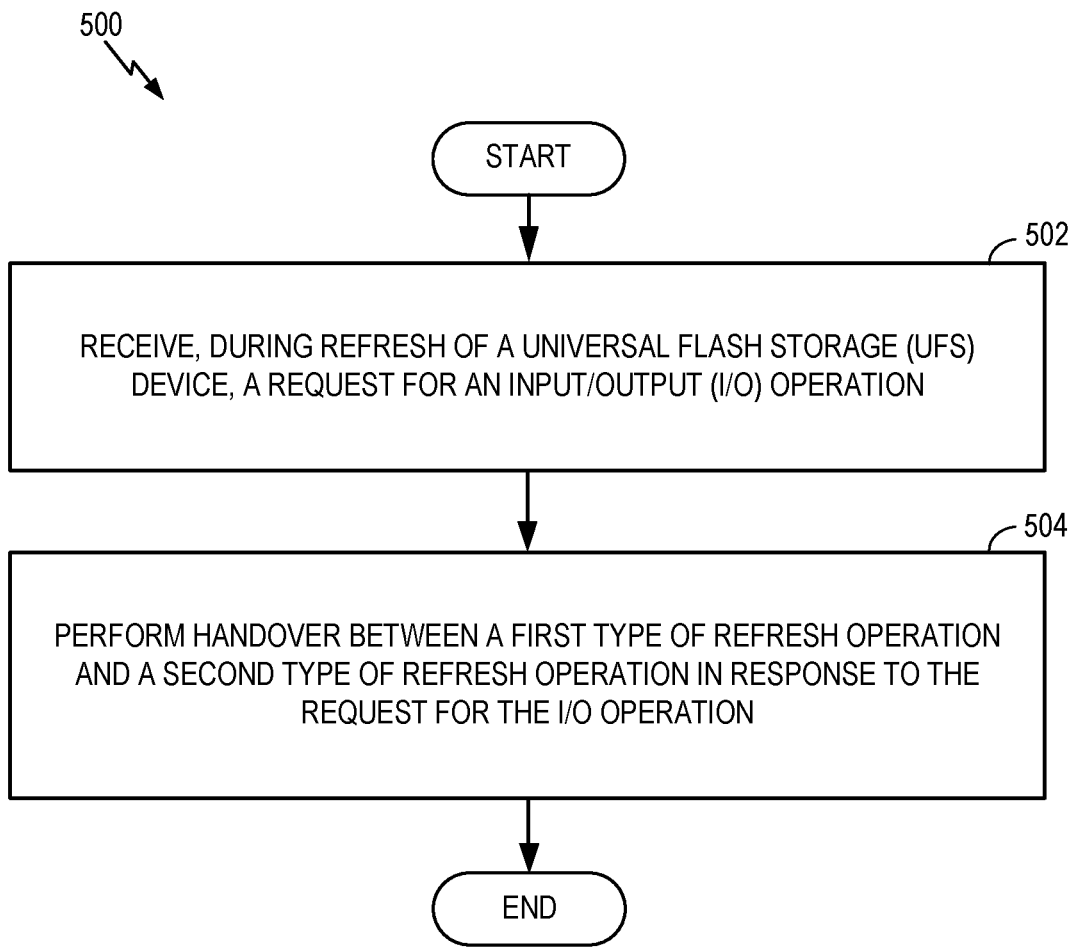
FIG. 5 is a flow diagram illustrating a method of scheduling universal flash storage (UFS) refresh schemes using a refresh handover mechanism, according to aspects of the present disclosure.

FIG. 5 is a flow diagram illustrating a method of scheduling universal flash storage (UFS) refresh operations using a refresh handover mechanism, according to aspects of the present disclosure. A method 500 begins at block 502, in which a request for a refresh operation is received during refresh of a universal flash storage (UFS) device (UFS device). For example, as shown in FIG. 4, in step 2) a request for an input/output (I/O) operation is received during a manual-force refresh operation. Alternatively, at step 3), a manual-selective refresh operation may be initiated during access by an I/O operation.

Referring again to FIG. 5, at block 504, a handover is performed between a first type of refresh operation and a second type of refresh operation in response to the request for the I/O operation. For example, in FIG. 4, in step 2) a handover is performed from the manual-force refresh operation to the manual-selective refresh operation after triggering of the I/O operation. Alternatively, handover from a manual-selective refresh operation to a manual-force refresh operation is delayed until after the I/O operation completes. In this aspect of the present disclosure, a host controller (e.g., host controller 200) intelligently performs handover between manual-selective and manual-force refresh by either performing the handover once the competing I/O request is initiated, or once the I/O request completes. This refresh handover mechanism avoids the stop/start penalty caused by pausing manual-force refresh operations to complete the I/O operation request.

Figure 6:
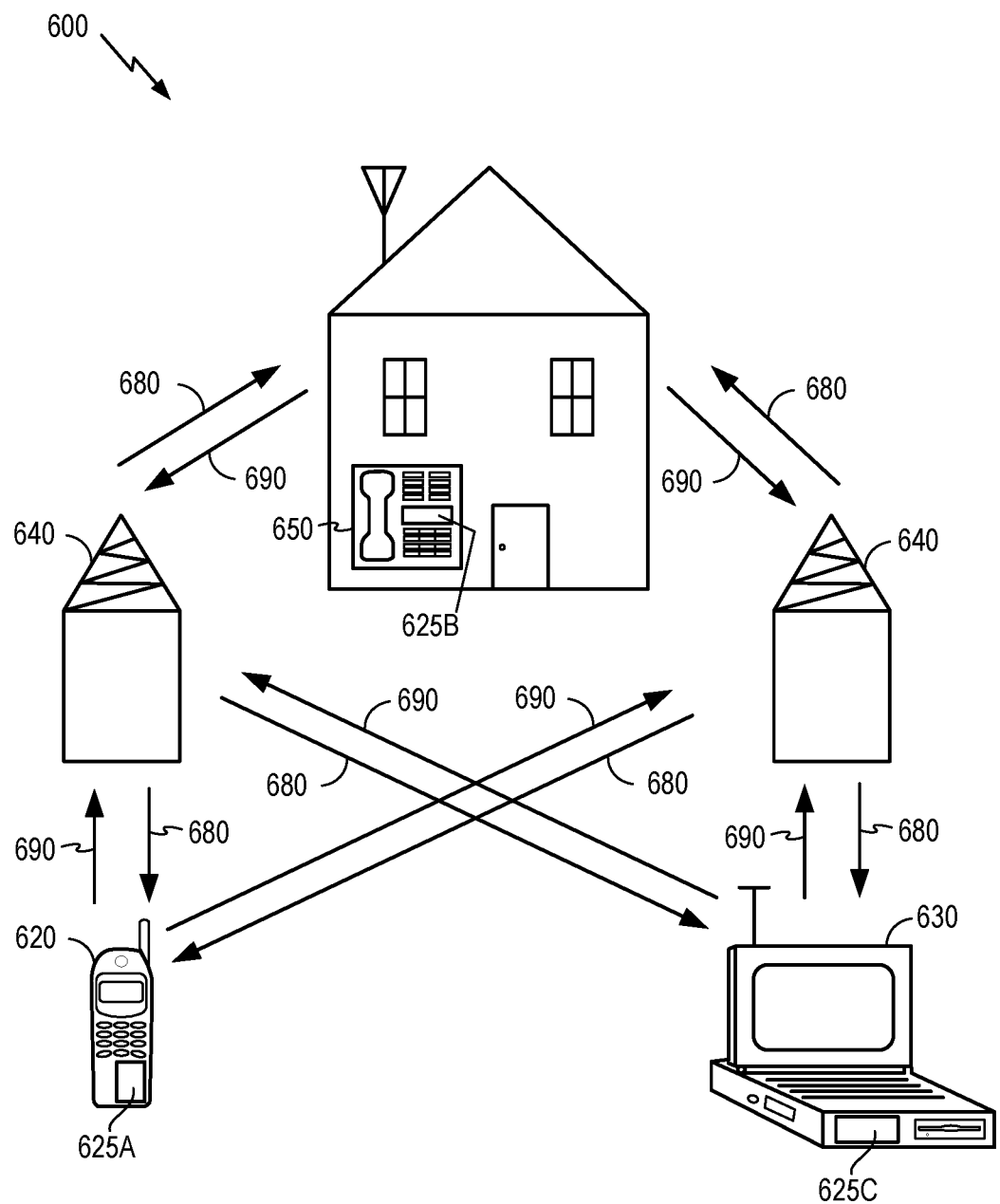
FIG. 6 is a block diagram showing a wireless communications system in which a configuration of the disclosure may be advantageously employed.

FIG. 6 is a block diagram showing an exemplary wireless communications system 600 in which a configuration of the disclosure may be advantageously employed. For purposes of illustration, FIG. 6 shows three remote units 620, 630, and 650 and two base stations 640. It will be recognized that wireless communications systems may have many more remote units and base stations. Remote units 620, 630, and 650 include IC devices 625A, 625B, and 625C, which include the disclosed UFS interface. It will be recognized that any device containing an IC may also include the disclosed UFS interface, including the base stations, switching devices, and network equipment. FIG. 6 shows forward link signals 680 from the base station 640 to the remote units 620, 630, and 650, and reverse link signals 690 from the remote units 620, 630, and 650 to base stations 640.

In FIG. 6, a remote unit 620 is shown as a mobile telephone, a remote unit 630 is shown as a portable computer, and a remote unit 650 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or any other device that stores or retrieves data or computer instructions, or any combination thereof. For example, a remote unit including the UFS interface may be integrated within a vehicle control system, a server computing system or other like system specifying critical data integrity. Although FIG. 6 illustrates IC devices 625A, 625B, and 625C, which include the disclosed UFS interface, the disclosure is not limited to these exemplary illustrated units. Aspects of the present disclosure may be suitably employed in any device, which includes the UFS interface.

For a firmware and/or software implementation, the methodologies may be implemented with modules (e.g., procedures, functions, and so on) that perform the described functions. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc, where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method of scheduling universal flash storage (UFS) operations using a refresh handover mechanism, the method comprising:
   receiving, during refresh of a UFS device, a request for an input/output (I/O) operation;
   handing over between a manual-force refresh operation and a manual-selective refresh operation in response to the request for the I/O operation when the I/O request is initiated during the manual-selective refresh operation; and then
   handing over from the manual-selective refresh operation to the manual-force refresh operation after the I/O operation completes.

2. The method of claim 1, further comprising performing the manual-selective refresh operation on the UFS device while the I/O operation completes.

3. The method of claim 1, in which handing over further comprises handing over from the manual-force refresh operation to the manual-selective refresh operation after initiating the I/O operation.

4. An apparatus configured to scheduling universal flash storage (UFS) operations using a refresh handover mechanism, the apparatus comprising:

a memory comprising a UFS device; and at least one processor coupled to the memory, the processor configured:

to receive, during refresh of the UFS device, a request for an input/output (I/O) operation;

to handover between a manual-force refresh operation and a manual-selective refresh operation in response to the request for the I/O operation when the I/O request is initiated during the manual-selective refresh operation; and then to handover from the manual-selective refresh operation to the manual-force refresh operation after the I/O operation completes.

5. The apparatus of claim 4, in which the processor is further configured to perform the manual-selective refresh operation on the UFS device while the I/O operation completes.

6. The apparatus of claim 4, in which the processor is further configured to handover from the manual-force refresh operation to the manual-selective refresh operation after initiating the I/O operation.

7. The apparatus of claim 4, further comprising one of a computing system, mobile computing device, Internet of Things device, or virtual reality or augmented reality system, incorporating the processor and the memory.

8. A non-transitory computer-readable medium having program code recorded thereon for scheduling universal flash storage (UFS) operations using a refresh handover mechanism, the program code executed by a processor and comprising:

program code to receive, during refresh of a UFS device, a request for an input/output (I/O) operation;

program code to handover between a manual-force refresh operation and a manual-selective refresh operation in response to the request for the I/O operation when the I/O request is initiated during the manual-selective refresh operation; and then program code to handover from the manual-selective refresh operation to the manual-force refresh operation after the I/O operation completes.

9. The non-transitory computer-readable medium of claim 8, further comprising program code to perform the manual-selective refresh operation on the UFS device while the I/O operation completes.

10. The non-transitory computer-readable medium of claim 8, in which the program code to handover further comprises program code to handover from the manual-force refresh operation to the manual-selective refresh operation after initiating the I/O operation.

\* \* \* \* \*